(12) United States Patent
Templeton et al.

(10) Patent No.: US 6,727,195 B2
(45) Date of Patent: Apr. 27, 2004

(54) METHOD AND SYSTEM FOR DECREASING THE SPACES BETWEEN WORDLINES

(75) Inventors: Michael K. Templeton, Atherton, CA (US); Mark S. Chang, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 151 days.

(21) Appl. No.: 09/777,457

(22) Filed: Feb. 6, 2001

(65) Prior Publication Data

US 2001/0045648 A1 Nov. 29, 2001

Related U.S. Application Data

(60) Provisional application No. 60/183,071, filed on Feb. 16, 2000.

(51) Int. Cl.$^7$ ............................................. H01L 21/336
(52) U.S. Cl. ..................... 438/942; 438/257; 438/945; 438/946; 438/947
(58) Field of Search ................................. 438/269, 257, 438/551, 552, 553, 545, 546, 907, 942, 945, 946, 947; 257/315, 775, 776, 797, 907, 908, 909, 777, 457

(56) References Cited

U.S. PATENT DOCUMENTS

| | | | | |
|---|---|---|---|---|
| 5,013,680 A | * | 5/1991 | Lowrey et al. | 437/52 |
| 5,674,764 A | * | 10/1997 | Liu et al. | 437/35 |
| 6,060,783 A | * | 5/2000 | Juengling et al. | 257/752 |
| 6,258,663 B1 | * | 7/2001 | Koh et al. | 438/254 |
| 6,258,678 B1 | * | 7/2001 | Liaw | 438/303 |

* cited by examiner

Primary Examiner—Amir Zarabian
Assistant Examiner—Christy Novacek
(74) Attorney, Agent, or Firm—Winstead Sechrest & Minick P.C.

(57) ABSTRACT

A method and system for providing a semiconductor device is disclosed. The method and system include providing a semiconductor substrate and providing a plurality of lines separated by a plurality of spaces. Each of the plurality of spaces preferably has a first width that is less than a minimum feature size. In one aspect, the method and system include providing a reverse mask having a plurality of apertures on an insulating layer. In this aspect, the method and system also include trimming the reverse mask to increase a size of each of the plurality of apertures, removing a portion of the insulating layer exposed by the plurality of trimmed apertures to provide a plurality of trenches and providing a plurality of lines in the plurality of trenches. In a second aspect, the method and system include providing a reverse mask on the insulating layer and removing a first portion of the insulating layer exposed by the plurality of apertures to provide a plurality of trenches. The reverse mask includes a plurality of apertures having a first width. Each of the plurality of trenches has a width. In this aspect, the method and system also include trimming a second portion of the insulating layers to increase the width of each of the plurality of trenches and providing a plurality of lines in the plurality of trenches.

11 Claims, 10 Drawing Sheets

Figure 7B.1

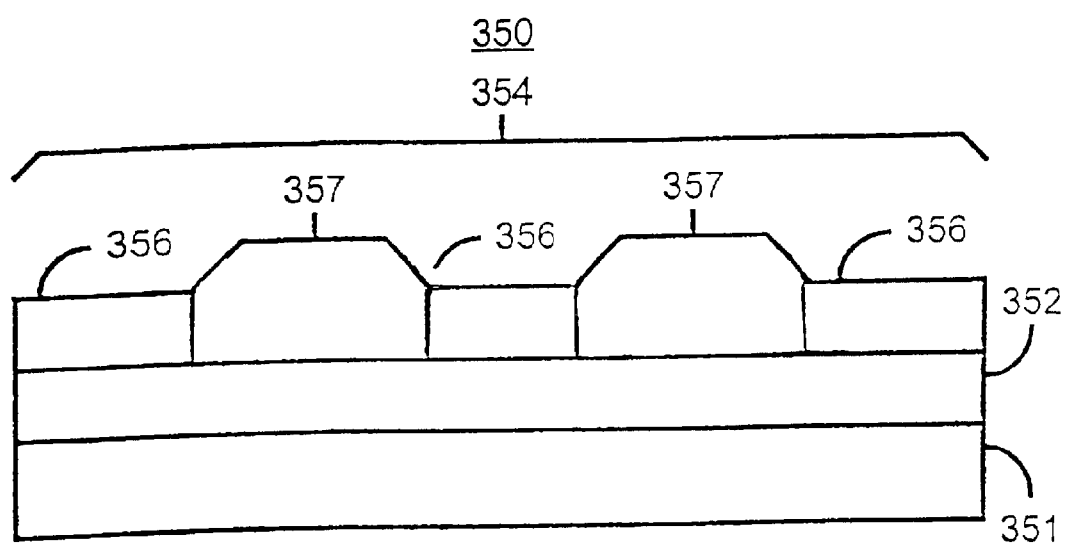
Figure 7B.2

METHOD AND SYSTEM FOR DECREASING THE SPACES BETWEEN WORDLINES

This application claims the benefit of provisional application No. 60/183,071 filed on Feb. 16, 2000.

FIELD OF THE INVENTION

The present invention relates to memory devices, and more particularly to a method and system for decreasing the spaces between word lines.

BACKGROUND OF THE INVENTION

Flash memory devices are currently a popular form of storage. In certain flash memory devices, such as in NAND technology, an asymmetric pitch is desired. For example, FIGS. 1A and 1B depicts such a flash memory device 1. Referring to FIG. 1A, the flash memory device 1 includes gate stacks 10 and 20 on a substrate 2. The gate stacks 10 and 20 share a source 6 and each have a drain 4 and 8, respectively. A thin insulating layer 9 also covers the semiconductor substrate 2. The gate stack 10 includes a floating gate 12, an insulating layer 14 and a control gate 16. Similarly, the gate stack 20 includes a floating gate 22, an insulating layer 24 and a control gate 26. The insulating layers 14 and 24 typically include an ONO layer, which has two oxide layers separated by a nitride layer. The floating gates 12 and 22 and the control gates 14 and 24 are typically formed using first and second polysilicon layers, respectively.

Referring to FIG. 1B, a plan view of the flash memos device 1 is show. Lines 30 and 32 are formed from the first polysilicon layer. The lines 30 and 32 form the floating gates at intersections between the lines 40, 42 and 44 and the lines 30 and 32. Similarly, the word lines 40, 42 and 44 form the control gates at the intersections between the lines 40, 42 and 44 and the lines 30 and 32. Word lines 40, 42 and 44 are formed from a second polysilicon layer. Typically, the portions of the lines 30 and 32 are removed using a self-aligned etch after the word lines 40, 42 and 44 are formed. This allows the floating gates for different memory cells to be electrically insulated in the case where the lines 30 and 32 are made of semi-conductive material such as polysilicon. In the flash memory device 1 shown, the pitch of the word lines 40, 42 and 44 is asymmetric. In other words, the width of the word lines 40, 42 and 44 is different from the width of the spaces 50 and 52 between the word lines 40, 42 and 44. In general, the word lines 40, 42 and 44 are desired to be slightly wider than the spaces 50 and 52 between the word lines 40, 42 and 44. Typically, the gate stacks 10 and 20 are desired to be closely spaced. Similarly, the word lines 40, 42 and 44 are desired to be as close as possible. Furthermore, the word lines are desired to be slightly larger than the spaces between the word lines. Thus, the smallest feature is generally the spaces 50 and 52 between the word lines 40, 42 and 44.

FIG. 2 depicts a conventional method 60 for providing the conventional flash memory device 1 in which the pitch of lines, such as the word lines 40, 42 and 44, is asymmetric. A polysilicon layer from which the word lines will be formed is deposited, via step 62. The polysilicon layer typically covers the ONO layer 14 and 24 for the gate stacks 10 and 20. A layer of photoresist is provided, via step 64. The photoresist is then exposed to print the desired asymmetric pattern onto the photoresist, forming an asymmetric mask, via step 66. Apertures in the asymmetric mask expose portions of the polysilicon to be etched and thus correspond to spaces 50 and 52 between the polysilicon lines 40, 42 and 44. Areas which the asymmetric mask covers will become the polysilicon lines 40, 42 and 44. Thus, the asymmetric mask has an asymmetric pitch that matches the desired asymmetric pitch of the word lines 40, 42 and 44.

The polysilicon is then etched to transfer the pattern on the asymmetric mask to the polysilicon, via step 68. Thus, the portions of the polysilicon exposed by apertures in the asymmetric mask are removed in step 68. Thus, polysilicon lines, such as the word lines 40, 42, and 44, are formed in step 68. The asymmetric mask is then stripped, via step 70. A layer of insulator is then deposited on the polysilicon lines, via step 72. The insulator fills the spaces 50 and 52 between the polysilicon lines.

Using the method 60, word lines 40, 42 and 44 having an asymmetric pitch can be formed. The width of the word lines 40, 42 and 44 as well as the spaces 50 and 52 between the word lines 40, 42 and 44 are defined by the asymmetric mask formed in steps 64 and 66. Thus, as discussed above, the asymmetric mask has the same asymmetric pitch as the word lines 40, 42 and 44. In other words, the width of the apertures in the asymmetric mask matches the width of the spaces 50 and 52 between the word lines 40, 42 and 44. Similarly, the portions of the asymmetric mask which cover the polysilicon have the same width as the word lines 40, 42 and 44. Thus, transferring the pattern of the asymmetric mask to the polysilicon layer in step 68 results in word lines 40, 42 and 44 having the desired asymmetric pitch.

Because the word lines 40, 42 and 44 are desired to be wider than the spaces between the lines, the areas in the asymmetric mask which cover the polysilicon layer are wider than the apertures in the asymmetric mask. Thus, the smallest feature in the asymmetric mask are the apertures and the smallest feature on the flash memory device 1 are the spaces 50 and 52 between the word lines 40, 42 and 44.

Although the method 60 functions, one of ordinary skill in the art will realize that the word lines 40, 42 and 44 cannot be packed closely together. The pitch of the word lines 40, 42 and 44 is limited by the spaces 50 and 52. The spaces 50 and 52 are the smallest feature on the flash memory device 1. Thus, the spaces 50 and 52 correspond to the apertures in the asymmetric mask. The size of the apertures is limited by the smallest feature that can be reliably printed on the asymmetric mask in step 66 and transferred to the polysilicon layer in step 68. The smallest feature that can be reliably printed is also known as the minimum feature size and is determined by resolution limit of the manufacturing tooling. The resolution limit of the manufacturing tooling is determined by the lens, the photomask and the light source used in the manufacturing tooling. Using certain current conventional techniques and certain manufacturing tooling, the minimum feature size for the asymmetric mask is approximately 0.15 micron. Note, however, that for other manufacturing tooling, the resolution limit and, therefore, the minimum feature size may be a different value. For the current conventional techniques and manufacturing tooling, the minimum feature size for the spaces 50 and 52 is approximately 0.15 micron. Consequently, for the flash memory device 1 to have an asymmetric pitch, each of the word lines 40, 42 and 44 must have a larger width than the spaces 50 and 52 and, therefore, must be greater than 0.15 micron in width. At the same time, the word lines 40, 42 and 44 are desired to be packed together as closely as possible. However, the widths of the spaces 50 and 52 are limited by the minimum feature size possible for the asymmetric mask. Thus, the packing of the word lines 40, 42 and 44 is also limited by the minimum feature size that can be printed on the asymmetric mask, typically approximately 0.15 microns. Thus, the pitch of the word lines is limited by the minimum feature size for printing the asymmetric mask.

Accordingly, what is needed is a system and method for decreasing the space between word lines, allowing the word lines to be packed more closely together and thus have a decreased pitch. The present invention addresses such a need.

SUMMARY OF THE INVENTION

The present invention provides a method and system for providing a semiconductor device. The method and system comprise providing a semiconductor substrate and providing a plurality of lines separated by a plurality of spaces. Each of the plurality of spaces preferably has a first width that is less than a minimum feature size. In one aspect, the method and system comprise providing a reverse mask having a plurality of apertures on an insulating layer. In this aspect, the method and system also comprise trimming the reverse mask to increase a size of each of the plurality of apertures, removing a portion of the insulating layer exposed by the plurality of trimmed apertures to provide a plurality of trenches and providing a plurality of lines in the plurality of trenches. In a second aspect, the method and system comprise providing a reverse mask on the insulating layer and removing a first portion of the insulating layer exposed by the plurality of apertures to provide a plurality of trenches. The reverse mask includes a plurality of apertures having a first width. Each of the plurality of trenches has a width. In this aspect, the method and system also comprise trimming a second portion of the insulating layers to increase the width of each of the plurality of trenches and providing a plurality of lines in the plurality of trenches.

According to the system and method disclosed herein, the present invention provides a semiconductor device in which the word lines can have an asymmetric pitch and in which the spaces between the word lines can be smaller than the resolution limit of the apparatus used to fabricate the semiconductor device. Therefore, word lines can be more closely spaced allowing for a higher density of memory cells in the semiconductor device.

BRIEF DESCRIPTION OF THE DRAWINGS

FIG. 7B.1–2 depicts the portion of the flash memory device in accordance with the alternate embodiments of the method in accordance with the present invention after provision of the mask.

DETAILED DESCRIPTION OF THE INVENTION

Figure 1A:
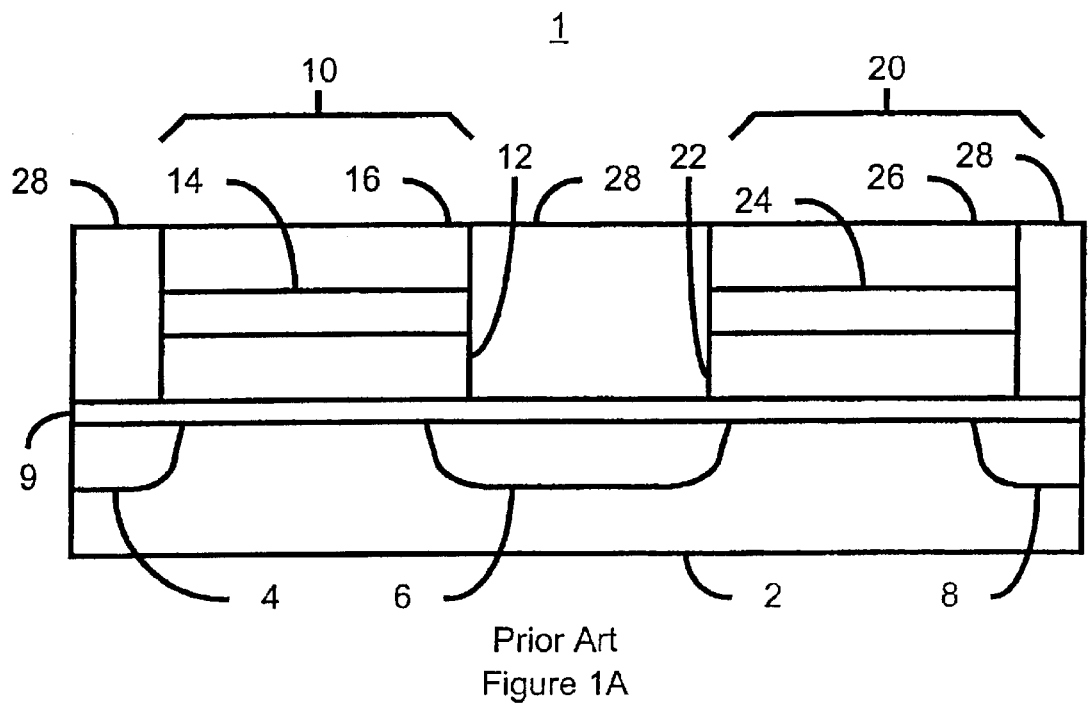
FIG. 1A is a side view of a conventional flash memory device.
Figure 1B:
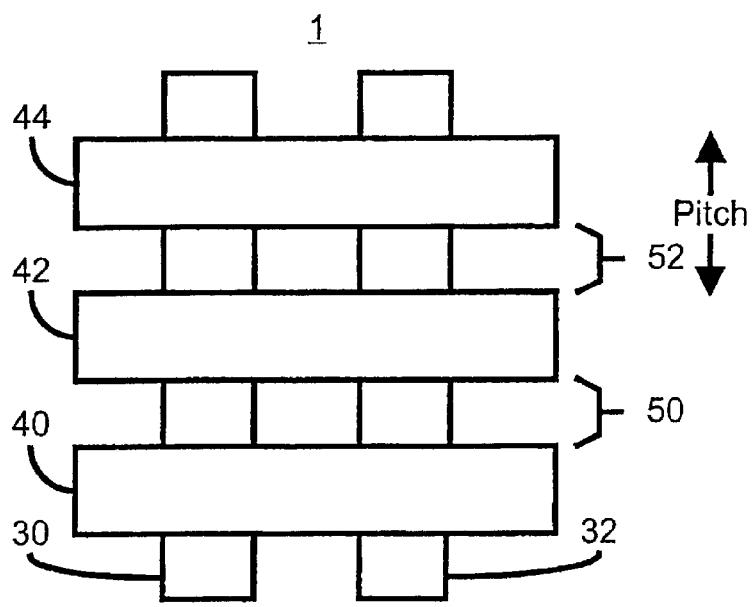
FIG. 1B is a plan view of the conventional flash memory device.

The present invention relates to an improvement in semiconductor devices, such as semiconductor devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Conventional flash memory devices, such as NAND devices, may have lines which have an asymmetric pitch. For example, the word lines in a NAND device may be desired to have a larger width than the spaces between the word lines. Typically, the word lines and the spaces between the word lines are formed using an asymmetric mask. The asymmetric mask is printed on a layer of photoresist and then transferred to an underlying layer of polysilicon. The spaces between the word lines are thus generally the smallest feature on the flash memory device as well as on the asymmetric mask.

One of ordinary skill in the art will realize that the size of the spaces between the word lines is limited by the size of the smallest feature that can be reliably printed on the asymmetric mask. The smallest feature that can be reliably printed is also known as the minimum feature size, which depends upon the resolution limit of the manufacturing tooling. The resolution limit of the manufacturing tooling depends upon the lens, light source and photomask used. The minimum feature size for the asymmetric mask is typically 0.15 microns for some conventional techniques and certain manufacturing tooling. Therefore, using conventional techniques, the space between two word lines is at least 0.15 microns, or the minimum feature size that can be printed on the asymmetric mask. Consequently, the spacing between word lines cannot be reduced below the minimum feature size of the asymmetric mask. Thus, the pitch of the word lines is limited by the resolution limit for printing the asymmetric mask.

The present invention provides a method and system for providing a semiconductor device. The method and system comprise providing a semiconductor substrate and providing a plurality of lines separated by a plurality of spaces. Each of the plurality of spaces preferably has a first width that is less than a minimum feature size of manufacturing tooling used. In one aspect, the method and system comprise providing a reverse mask having a plurality of apertures on an insulating layer. In this aspect, the method and system also comprise trimming the reverse mask to increase a size of each of the plurality of apertures, removing a portion of the insulating layer exposed by the plurality of trimmed apertures to provide a plurality of trenches and providing a plurality of lines in the plurality of trenches. In a second aspect, the method and system comprise providing a reverse mask on the insulating layer and removing a first portion of the insulating layer exposed by the plurality of apertures to provide a plurality of trenches. The reverse mask includes a plurality of apertures having a first width. Each of the plurality of trenches has a width. In this aspect, the method and system also comprise trimming a second portion of the insulating layers to increase the width of each of the plurality of trenches and providing a plurality of lines in the plurality of trenches.

The present invention will be described in terms of a particular method and a particular minimum feature size. However, one of ordinary skill in the art will readily recognize that this method and system will operate effectively for other minimum feature sizes, other resolution limits and other steps in another method. Furthermore, for the purposes of clarity, only some steps used in fabricating a semiconductor device are discussed. However, one of ordinary skill in the art will readily recognize that individual steps may involve substeps and that other steps may be used. The present invention is also discussed in the context of a preferred embodiment for polysilicon word lines. However, one of ordinary skill in the art will readily realize that the present invention is consistent with the use of other materials, such as metals like W or silicides, and for other lines. Furthermore, the present invention will be described in the context of providing lines having an asymmetric pitch using a mask having a symmetric pitch. However, one of ordinary skill in the art will readily realize that the present invention is consistent with lines having either an asymmetric or a symmetric pitch and the use of photomasks and masks having an asymmetric or a symmetric pitch. In addition, although the method and system in accordance with the present invention are described in the context of flash memory device, the method and system can be extended to other semiconductor devices.

Figure 3A:
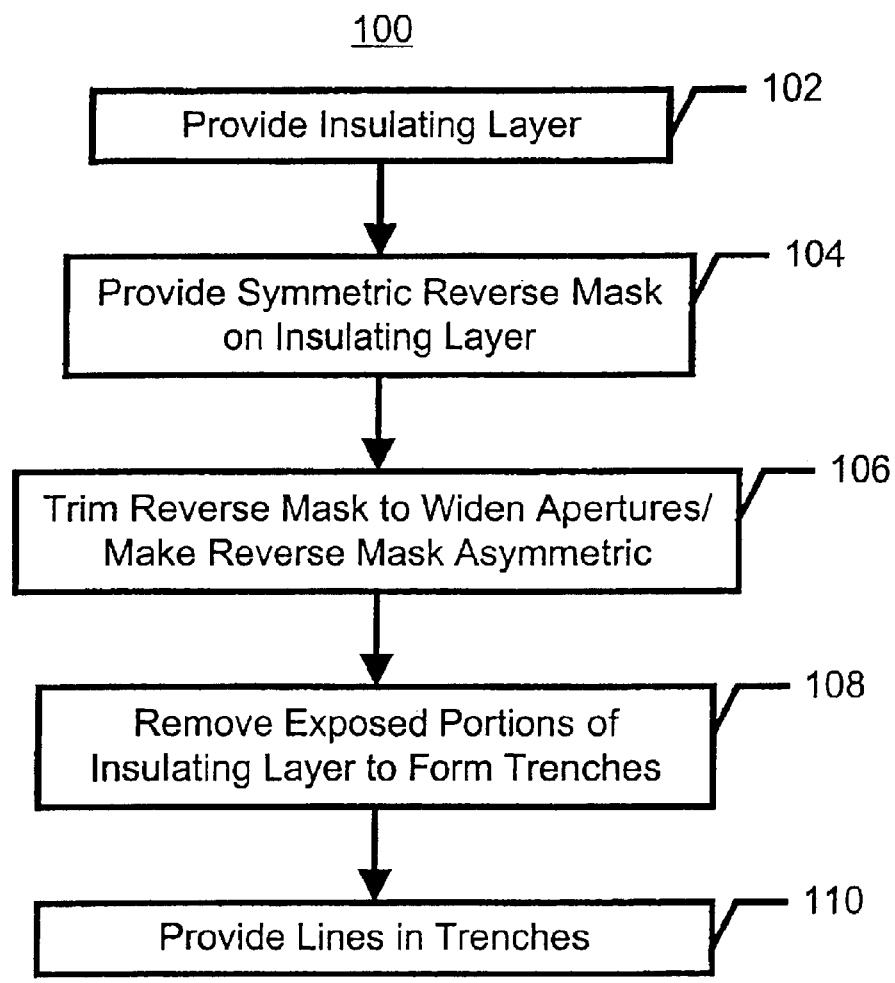
FIG. 3A is a flow chart of method in accordance with the present invention for providing a flash memory device.

To more particularly illustrate the method and system in accordance with the present invention, refer now to FIG. 3A, depicting one embodiment of a method 100 for providing lines in accordance with the present invention. The method 100 will be discussed in the context of providing polysilicon word lines. However, one of ordinary skill in the art will readily realize that the method 100 can be used with other materials or for providing other lines. The method 100 will also be explained with reference to FIGS. 4A–4E, which depict side views of a portion of the flash memory device during fabrication. Not depicted in FIGS. 4A–E are any floating gates and ONO layers which may be part of the flash memory device 150.

Figure 4A:
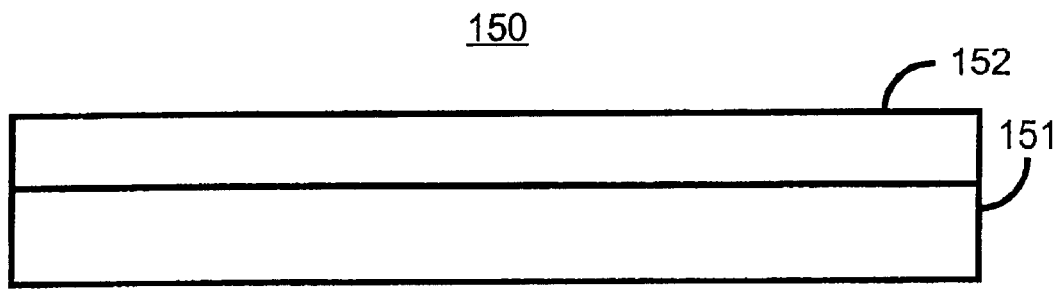
FIG. 4A depicts a portion of a flash memory device in accordance with the present invention after deposition of the insulating layer.

The method 100 preferably commences after floating gates and an insulator above the floating gates have been provided. The insulator is preferably an ONO layer consisting of two oxide layers separated by a nitride layer. An insulating layer is provided over the substrate, and any floating gates and insulators, via step 102. Preferably, the insulating layer is an oxide layer. FIG. 4A depicts the flash memory device 150 after an oxide layer 152 has been provided over a substrate 151.

Figure 4B:
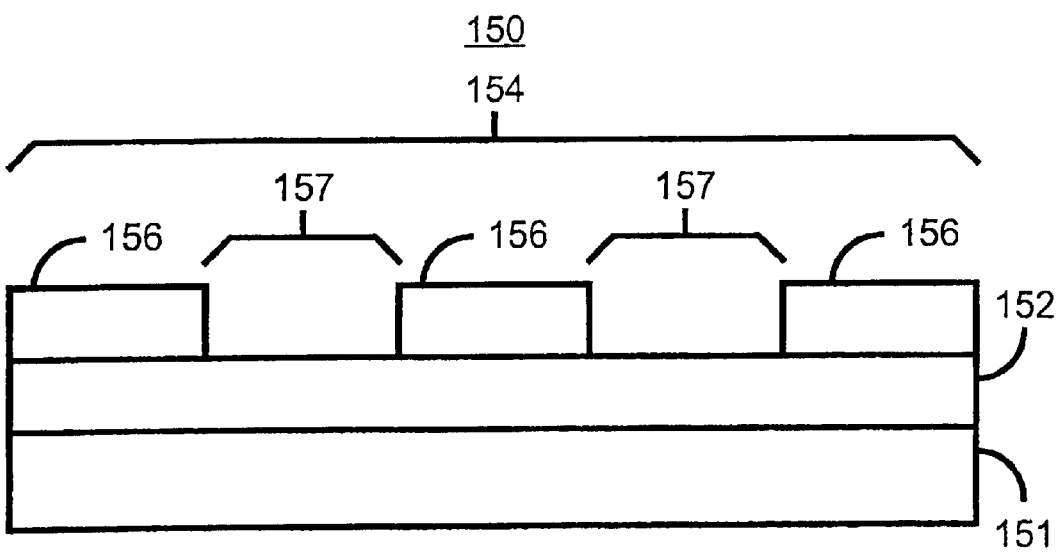
FIG. 4B depicts the portion of the flash memory device in accordance with the present invention after provision of the reverse mask.

A reverse mask that is preferably symmetric is then provided on the insulating layer, via step 104. Preferably, the reverse mask is provided by spinning on a layer of photoresist onto the insulating layer and printing a preferably symmetric pattern on the photoresist. The reverse mask includes apertures where the word lines are to be provided and covers regions of the insulating layer that will become the spaces between the word lines. In a preferred embodiment, the width of the apertures in the reverse mask and the width of the regions in the reverse mask covering the portion of the insulating layer that will become the spaces between the polysilicon layers are the minimum size that can be printed. In other words, the reverse mask is preferably printed at the resolution limit of the manufacturing tools used. Thus, in one embodiment, the apertures in the reverse mask are 0.15 microns in width. FIG. 4B depicts the flash memory device 150 after the reverse mask 154 containing photoresist 156 and apertures 157 is provided. The apertures 157 cover regions where the word lines will be provided, while the photoresist 156 covers regions which will become the spaces between the word lines.

Figure 4C:
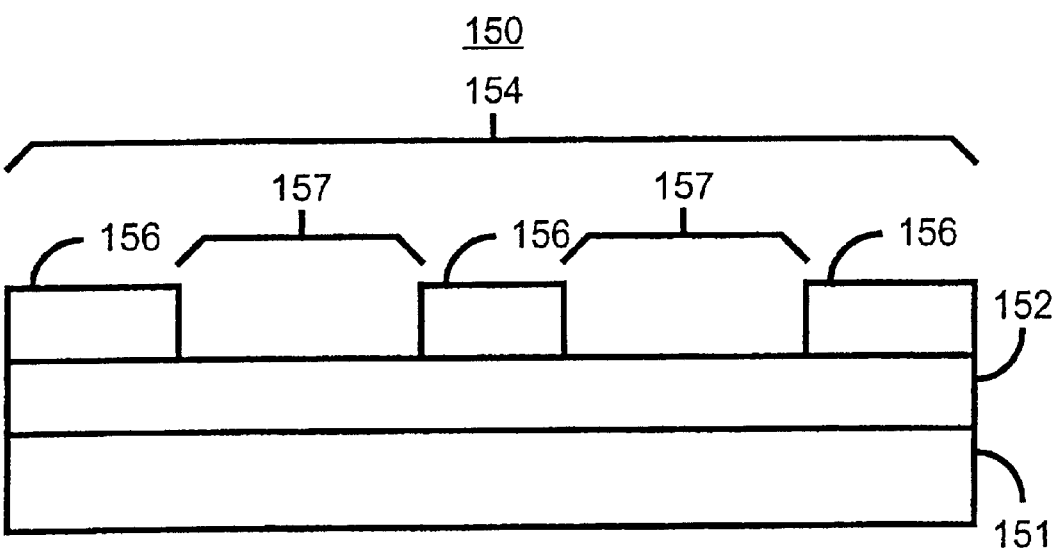
FIG. 4C depicts the portion of the flash memory device in accordance with the present invention after trimming of the reverse mask.

The reverse mask 154 is then trimmed to increase the width of the apertures 157 that correspond to the word lines, via step 106. In a preferred embodiment, step 106 includes performing an etch that makes the apertures 157 larger and the photoresist 156 corresponding to the spaces smaller. Thus, the areas that will become spaces can be made smaller than the photoresist 156 as printed on the reverse mask 154. Similarly, trimming the reverse mask 154 will make the word lines made using the method 100 wider than the apertures 157 as printed. FIG. 4C depicts the flash memory device 150 after trimming of the reverse mask 154.

Figure 4D:
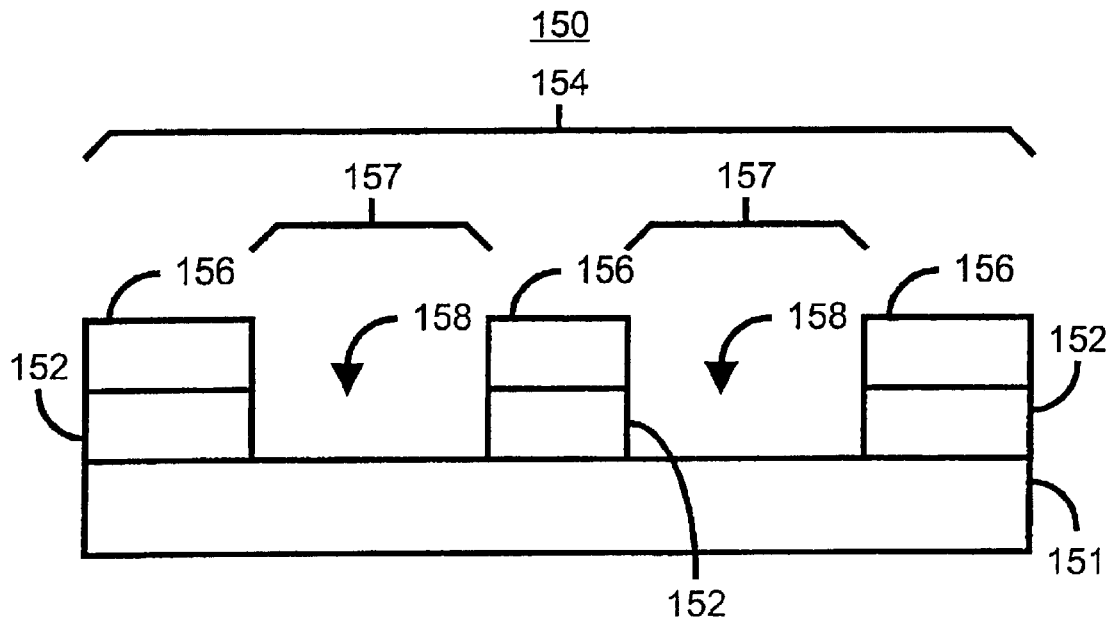
FIG. 4D depicts the portion of the flash memory device in accordance with the present invention after etching of the insulating layer.

The insulating layer 152 is then etched to transfer the pattern from the trimmed reverse mask 154 to the insulating layer 152, forming trenches in the insulating layer 152, via step 108. In a preferred embodiment, the insulating layer under the apertures 157 is etched through to expose the underlying structures to which contact is desired to be made. However, where the lines being formed are word lines, care should be taken to ensure that the ONO layer separating the control gate, or word line, from the floating gate is not etched through. FIG. 4D depicts the flash memory device 150 after the pattern of the reverse mask 154 has been transferred to the insulating layer 152 using step 108. Thus, trenches 158 in the insulating layer 152 have been formed.

Figure 4E:
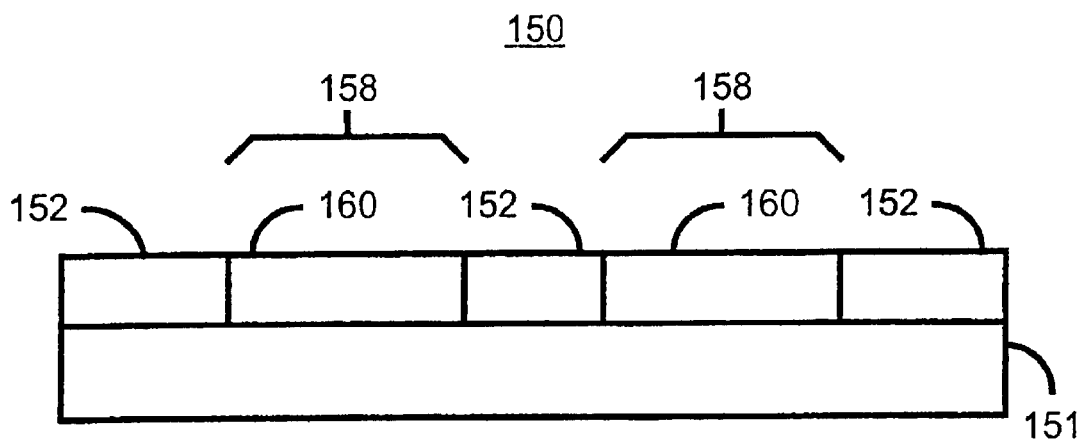
FIG. 4E depicts the portion of the flash memory device in accordance with the present invention after the polysilicon lines have been provided.

The desired lines are then provided in the trenches 158 in the insulating layer 152, via step 110. Preferably, the lines provided in step 110 are polysilicon word lines. FIG. 4E depicts the flash memory device 150 after the word lines 160 have been provided in the trenches 158. Thus, the polysilicon word lines 160 may be wider than the remaining portions of the insulating layer 152 that form the spaces between the polysilicon word lines. Preferably, the spaces 152 are not only less wide than the word lines 160, but also thinner than the minimum feature size printed in the symmetric reverse mask 154. Thus, the spaces 152 are less wide than the minimum feature for the manufacturing tooling in printing the reverse mask 154. This width for the spaces 152 is made possible by the trimming of the reverse mask in step 106. As a result, the pitch of the word lines 160 can be decreased while remaining asymmetric. Even where the resolution limit of printing the reverse mask is not reached, the spaces 152 are less wide than the photoresist 156 as printed in the reverse mask 154.

Figure 3B:
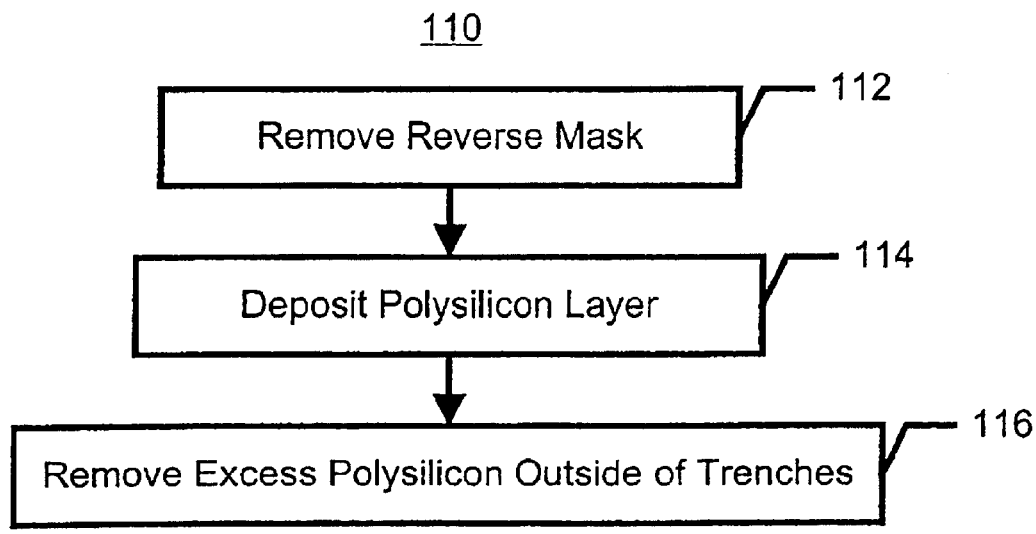
FIG. 3B depicts a more detailed flow chart of the step of providing polysilicon lines in accordance with the present invention.

FIG. 3B depicts a preferred embodiment of the step 110 of providing the lines. Preferably, step 110 is used in providing polysilicon word lines. The reverse mask 154 is stripped, via step 112. A layer, preferably polysilicon, which will form the lines, is then provided, via step 114. A portion of the polysilicon outside of the trenches 158 is then removed, via step 116. Preferably, the polysilicon layer provided in step 114 is polished in step 116 to remove the excess polysilicon. The remaining portion of the polysilicon in the trenches forms the word lines.

Figure 5A:
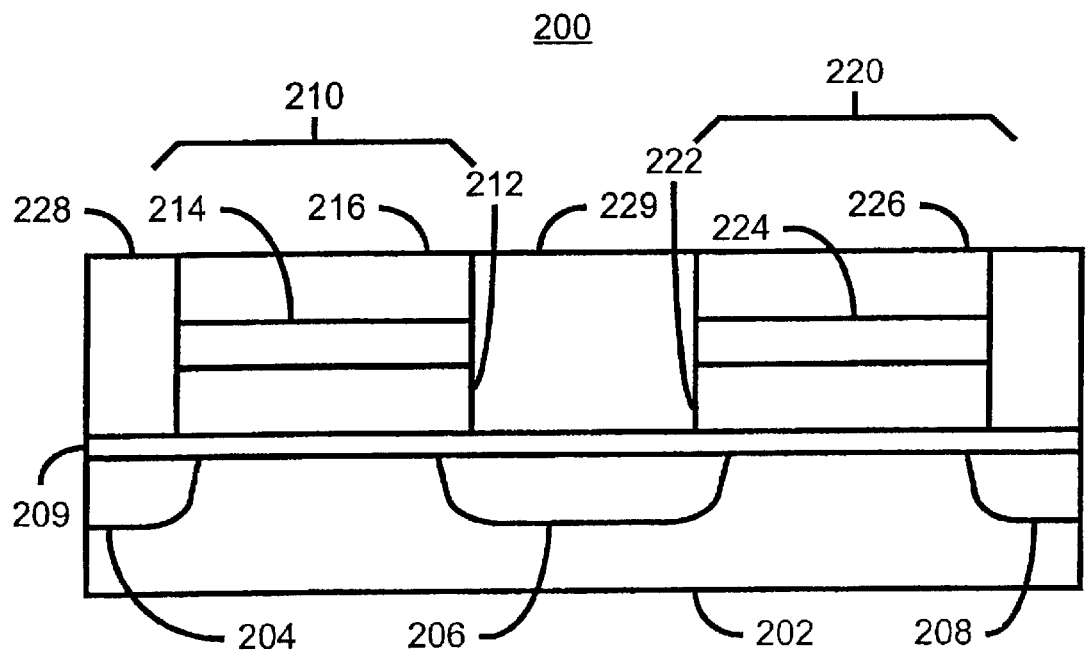
FIG. 5A is a side view of a flash memory device in accordance with the present invention.
Figure 5B:
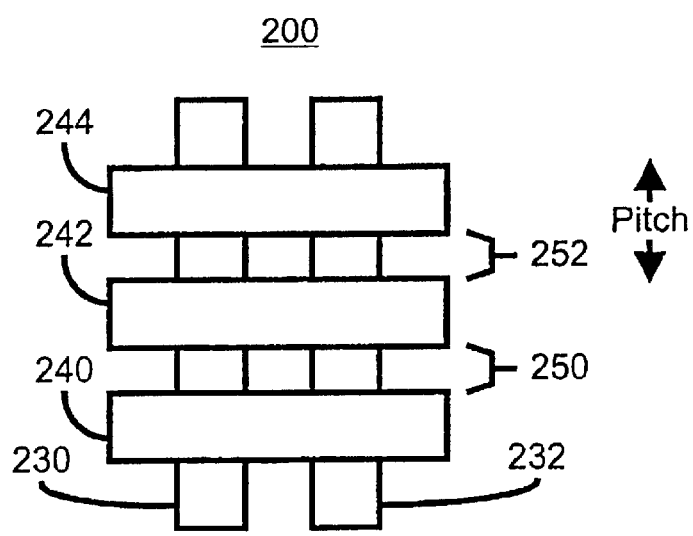
FIG. 5B is a plan view of a flash memory device in accordance with the present invention.

FIGS. 5A and 5B depict a side view and a plan view of a portion of a flash memory device 200 in accordance with the present invention. The flash memory device 200 preferably includes gate stacks 210 and 220 formed on a substrate 202. A common source 206 and drains 204 and 208 are implanted. In addition, a thin insulating layer 209, preferably an oxide, is provided. The gate stack 210 also includes floating gate 212, insulator 214 and control gate 216. Similarly, the gate stack 220 also includes floating gate 222, insulator 224 and control gate 226. The control gates 216 and 226 are portions of word lines. Preferably, the insulators 214 and 224 are formed of ONO, while the floating gates 212 and 222 and the control gates 216 and 226 are formed of polysilicon. An insulator, preferably oxide, fills regions 228 and 229 between the gate stacks 210 and 220.

Figure 2:
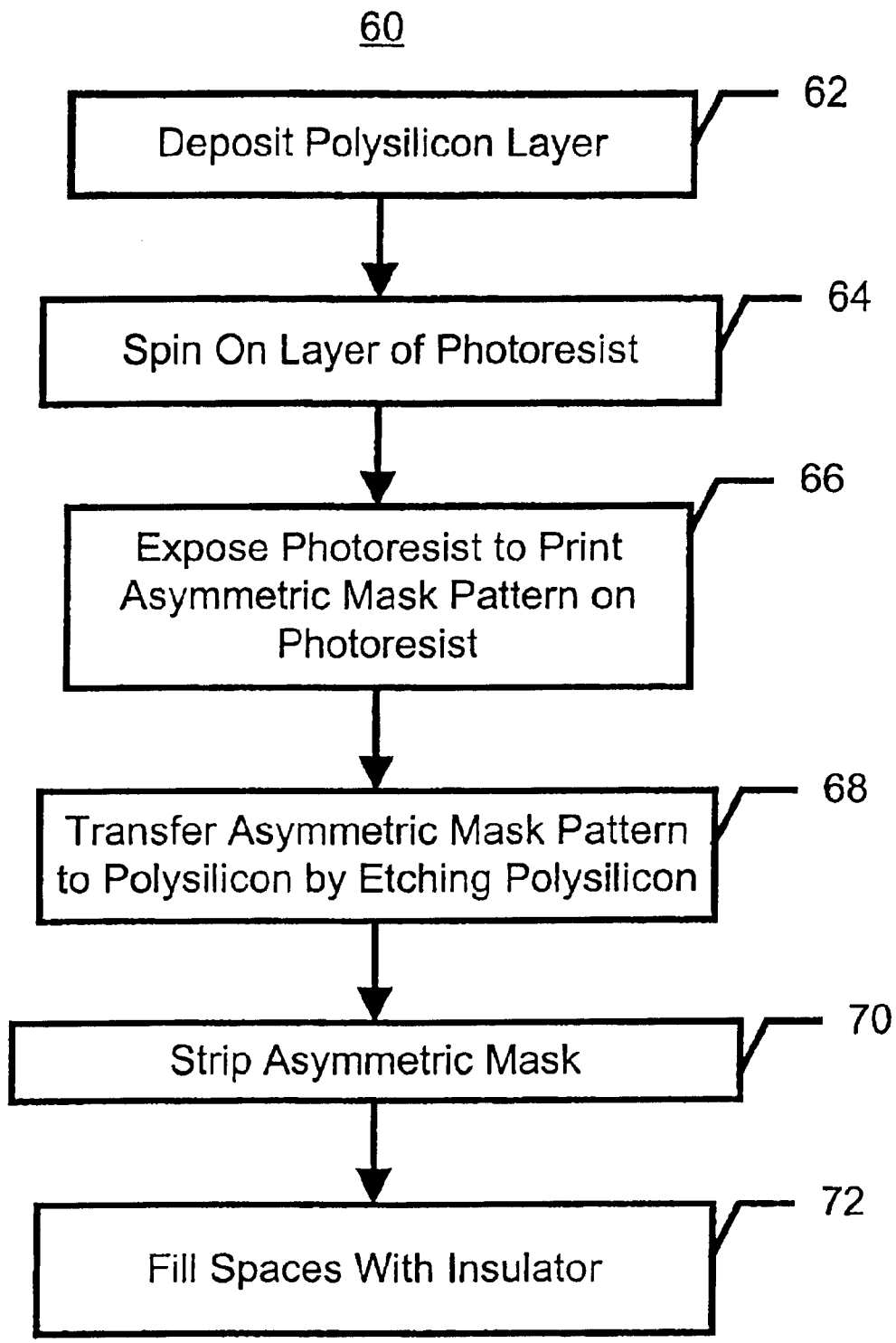
FIG. 2 is a flow chart depicting a conventional method for forming a conventional flash memory device.

FIG. 5B depicts a plan view of the flash memory device 200. For clarity, only word lines 240, 242 and 244 and lines 230 and 232 are depicted. The lines 230 and 232 preferably form the floating gates at intersections between the lines 240, 242 and 244 and the lines 230 and 232. Note that the portions of the lines 230 and 232 between the lines 240, 242 and 244 must be accounted for to ensure that the floating gates for different memory cells are not electrically connected. For example, the portions of the lines 230 and 232 between the lines 240, 242 and 244 may be removed, preferably before the insulating layer 152 is provided, or the lines 230 and 232 may be made of an insulating or other material which prevents electrical connection between the floating gates of different memory cells. The word lines 240, 242 and 244 preferably form the control gates at the intersections between the lines 240, 242 and 244 and the lines 230 and 232. Spaces 250 and 252 between word lines 240, 242 and 244 are also depicted. The pitch of the word lines 240, 242 and 244 is asymmetric. Thus, the width of the spaces 250 and 252 between word lines 240, 242 and 244 is different from and smaller than the width of the word lines 240, 242 and 244. Because the word lines 240, 242 and 244 were formed using a reverse mask that had been trimmed and which is preferably symmetric before trimming, the spaces 250 and 252 are narrower than the word lines 240, 242 and 244. The photoresist in the reverse mask that covers portions of the insulating layer which would become the spaces 250 and 252 is preferably at the minimum feature size for printing the reverse mask prior to trimming. Thus, the spaces 250 and 252 are preferably narrower than the minimum feature size that can be printed for the reverse mask. This is achieved by printing the reverse mask at the minimum feature size. Consequently, the word lines 240, 242 and 244 can be separated by a smaller distance than in a conventional flash memory device. As a result, the word lines 240, 242 and 244 and, therefore, memory cells within the flash memory device 200 can be more densely packed. The pitch of the word lines 240, 242 and 244 is thus decreased while remaining asymmetric. Preferably, the pitch of the word lines 240, 242 and 244 can be made smaller than by printing an asymmetric mask at the minimum feature size, as in the conventional method 60 depicted in FIG. 2.

Figure 6A:
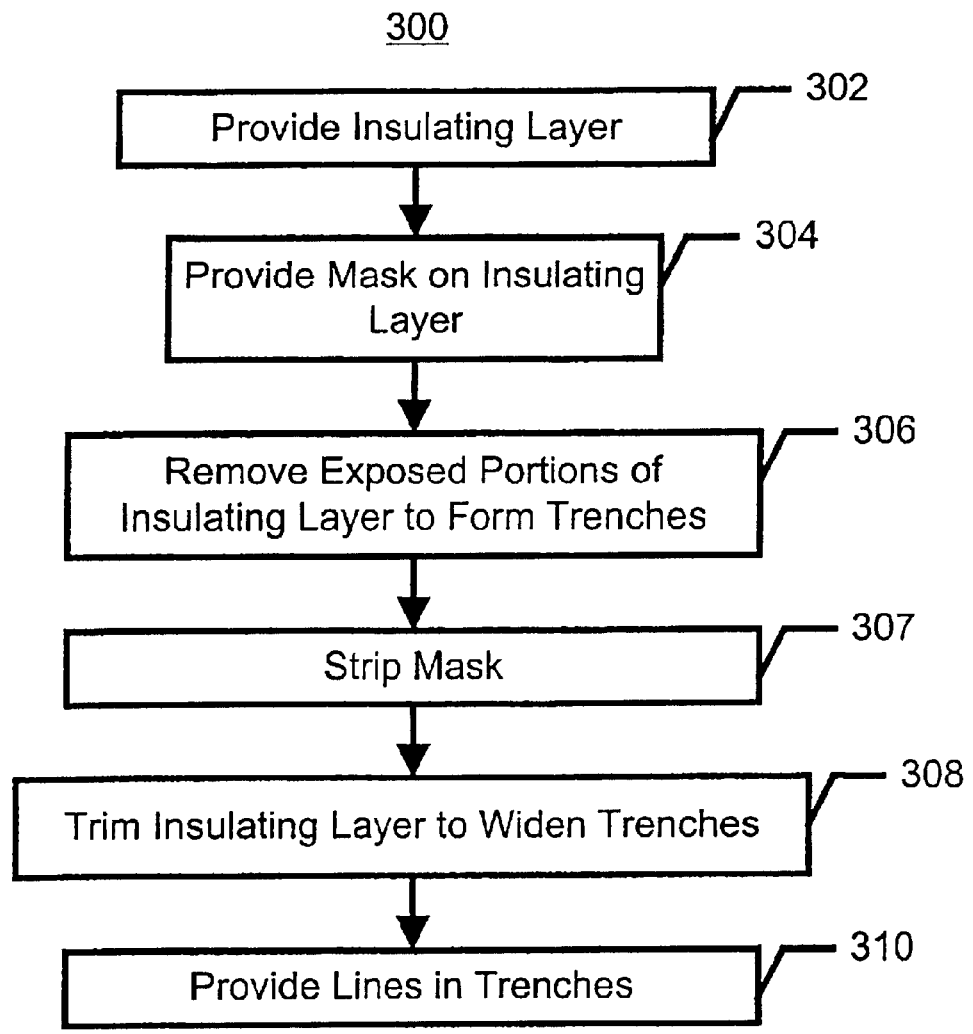
FIG. 6A is a flow chart of an alternate method in accordance with the present invention for providing a flash memory device.

FIG. 6A depicts an alternate embodiment of a method 300 for providing lines in accordance with the present invention. The resultant of the method 300 is preferably a flash memory device that is substantially the same as the flash memory device 200 depicted in FIGS. 5A and 5B. Referring back to FIG. 6A, the method 300 will be discussed in the context of providing polysilicon word lines. However, one of ordinary skill in the art will readily realize that the method 300 can be used with other materials or for providing other lines. The method 300 will also be explained with reference to FIGS. 7A–7E, which depict side views of a portion of the flash memory device during fabrication. Not depicted in FIGS. 7A–E are any floating gates and ONO layers which may be part of the flash memory device 350.

Figure 7A:
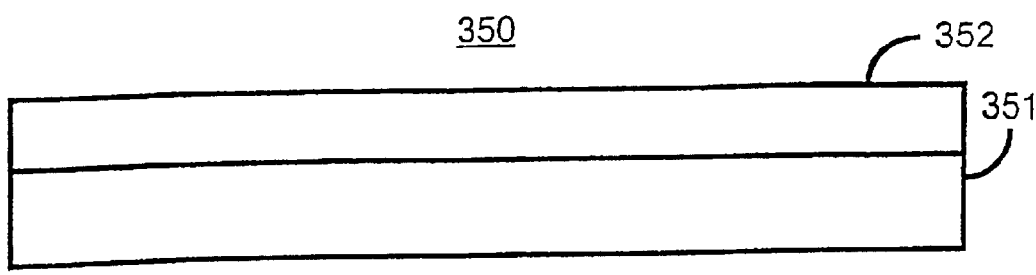
FIG. 7A depicts a portion of a flash memory device in accordance with the alternate embodiment of the method in accordance with the present invention after deposition of the insulating layer.

The method 300 preferably commences after floating gates and an insulator above the floating gates have been provided. The insulator is preferably an ONO layer consisting of two oxide layers separated by a nitride layer. An insulating layer is provided over the substrate, and any floating gates and insulators, via step 302. Preferably, the insulating layer is an oxide layer. FIG. 7A depicts the flash memory device 350 after an oxide layer 352 has been provided over a substrate 351.

A reverse mask that is preferably symmetric is then provided on the insulating layer, via step 304. Preferably, the reverse mask is provided by spinning on a layer of photoresist onto the insulating layer and printing a preferably symmetric pattern on the photoresist. The reverse mask includes apertures where the word lines are to be provided and covers regions of the insulating layer that will become the spaces between the word lines. In a preferred embodiment, the width of the apertures in the reverse mask and the width of the regions in the reverse mask covering the portion of the insulating layer that will become the spaces between the polysilicon layers are the minimum size that can be reliably printed. In other words, the reverse mask is preferably printed at the minimum feature size of the manufacturing tools used. Thus, in one embodiment, the apertures in the mask are 0.15 microns in width. FIG. 7B.1 depicts the flash memory device 350 after the reverse mask 354 containing photoresist 356 and apertures 357 is provided. The apertures 357 cover regions where the word lines will be provided, while the photoresist 356 covers regions which will become the spaces between the word lines. In an alternative embodiment, as shown in FIG. 7B.2, apertures 357 may be separated by a distance that is different from the width of apertures 357. Hence, apertures 357 may have an asymmetric pitch. It is noted that even though the following description depicts apertures 357 having a symmetric pitch that embodiments of the present invention are not to be limited to apertures 357 having a symmetric pitch. It is further noted that a person of ordinary skill in the art would readily recognize that apertures 357 may have either an asymmetric pitch or a symmetric pitch. However, for the sake of brevity, the following description and figures describe apertures 357 having a symmetric pitch.

Figure 7C:
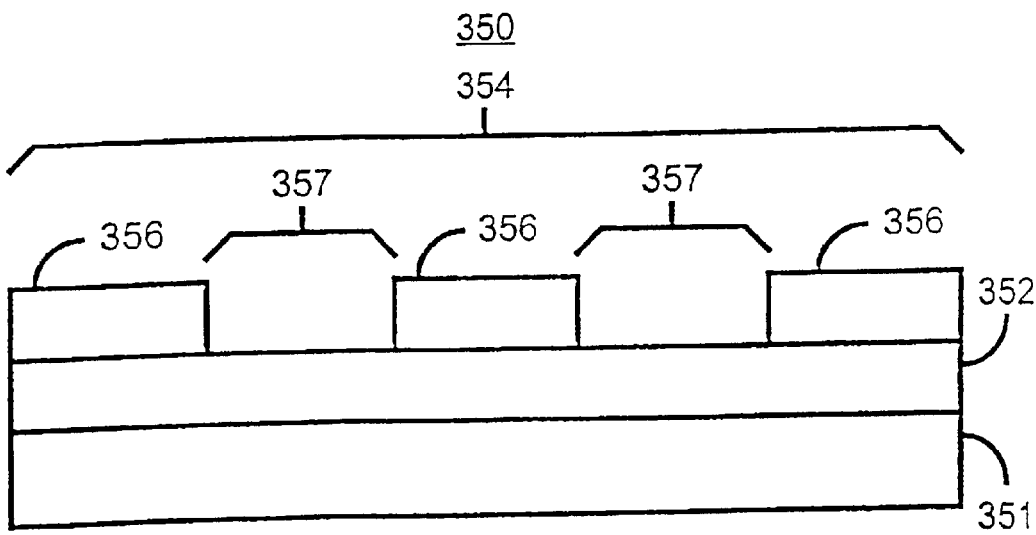
FIG. 7C depicts the portion of the flash memory device in accordance with the alternate embodiment of the method in accordance with the present invention after etching of the insulating layer to provide trenches.
Figure 7C:
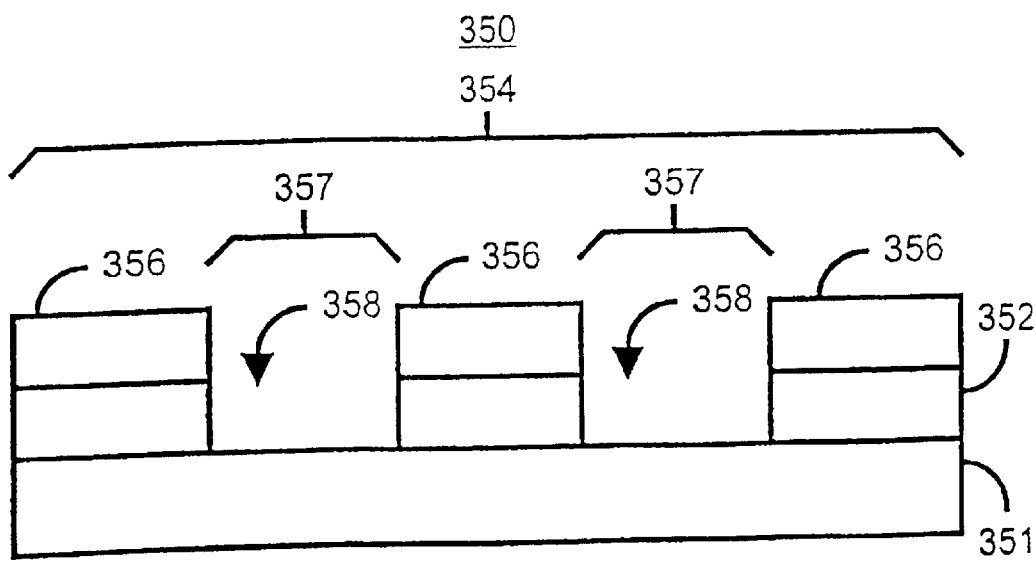

The insulating layer 352 is then etched to transfer the pattern from the reverse mask 354 to the insulating layer 352, forming trenches in the insulating layer 352, via step 306. In a preferred embodiment, the insulating layer under the apertures 357 is etched through to expose the underlying structures to which contact is desired to be made. However, where the lines being formed are word lines, care should be taken to ensure that the ONO layer separating the control gate, or word line, from the floating gate is not etched through. FIG. 7C depicts the flash memory device 350 after the pattern of the mask 354 has been transferred to the insulating layer 352 using step 306. Thus, trenches 358 in the insulating layer 352 have been formed. The reverse mask is preferably stripped, via step 307.

Figure 7D:
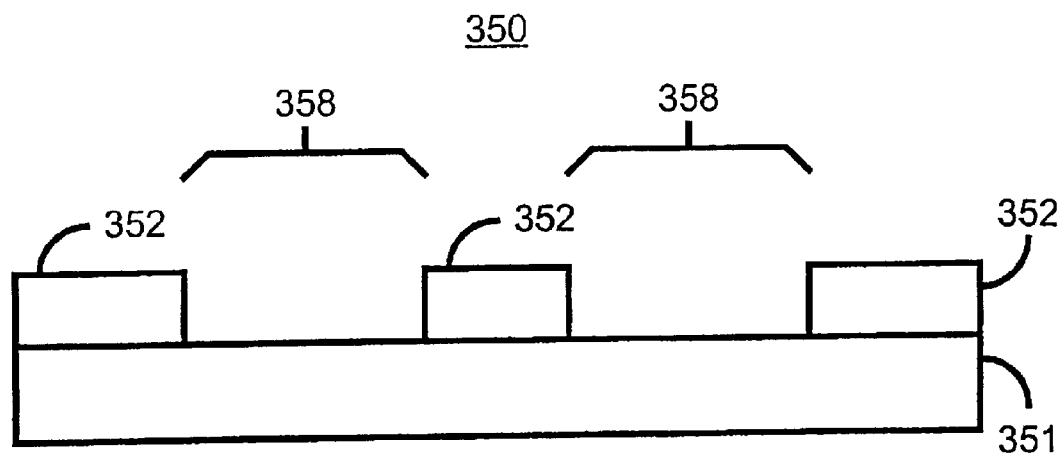
FIG. 7D depicts the portion of the flash memory device in accordance with the alternate embodiment of the method in accordance with the present invention after trimming of the insulating layer.

The insulating layer 352 is then trimmed to increase the width of the trenches 358 that correspond to the word lines, via step 308. In a preferred embodiment, step 308 includes performing an etch that makes the trenches 358 larger and the photoresist 356 corresponding to the spaces smaller. Thus, the areas that will become spaces can be made smaller than the photoresist 356 as printed on the mask 354. Similarly, trimming the insulating layer 352 will make the word lines made using the method 300 wider than the apertures 357 as printed. FIG. 7D depicts the flash memory device 350 after trimming of the insulating layer 352.

Figure 7E:
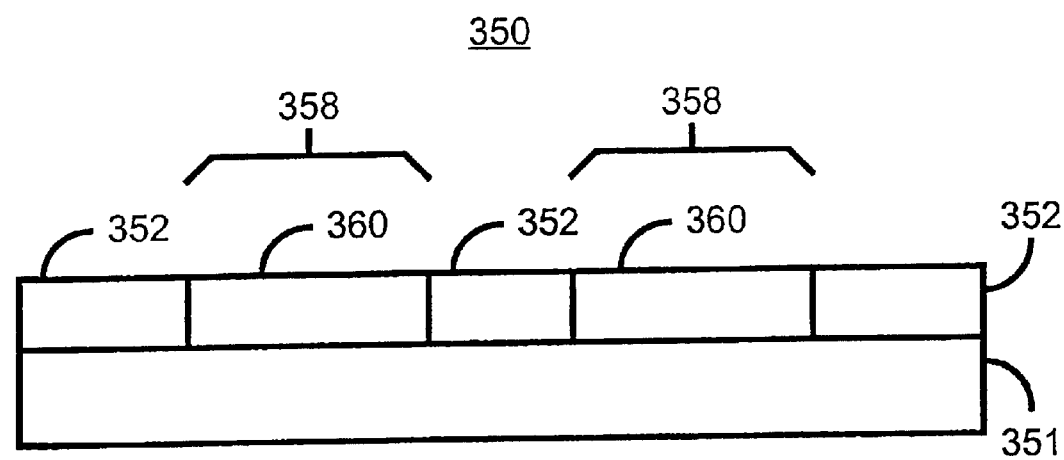
FIG. 7E depicts the portion of the flash memory device in accordance with the alternate embodiment of the method in accordance with the present invention after the polysilicon lines have been provided.

The desired lines are then provided in the trenches 358 in the insulating layer 352, via step 310. Preferably, the lines provided in step 310 are polysilicon word lines. FIG. 7E depicts the flash memory device 350 after the word lines 360 have been provided in the trenches 358. Thus, the polysilicon word lines 360 may be wider than the remaining portions of the insulating layer 352 that form the spaces between the polysilicon word lines. Preferably, the spaces 352 are not only less wide than the word lines 360, but also narrower than the minimum feature size printed in the symmetric reverse mask 354. The width for the spaces 352 is made possible by the trimming of the insulating layer in step 308. As a result, the pitch of the word lines 360 can be decreased while remaining asymmetric. Even where the minimum feature size of printing the reverse mask is not reached, the spaces 352 are less wide than the photoresist 356 as printed in the reverse mask 354.

Figure 6B:
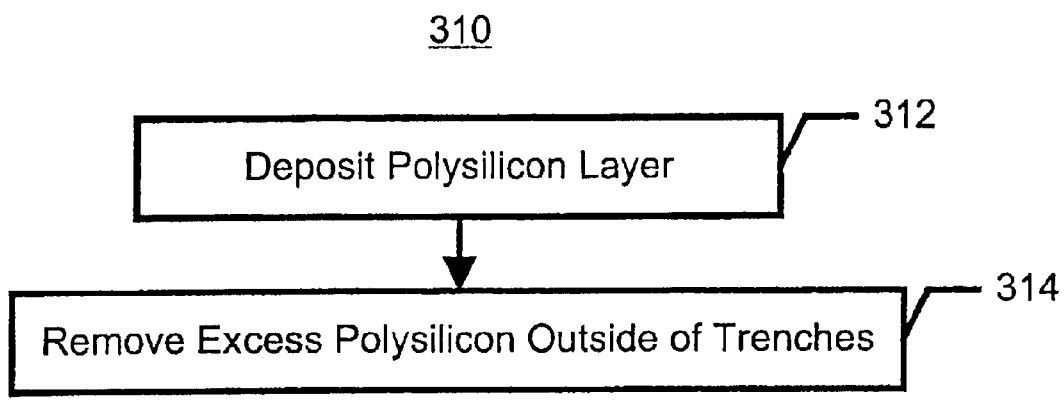
FIG. 6B depicts a more detailed flow chart of the step of providing polysilicon lines in accordance with the present invention.

FIG. 6B depicts a preferred embodiment of the step 310 of providing the lines. Preferably, step 310 is used in providing polysilicon word lines. A layer, preferably polysilicon, which will form the lines, is then provided, via step 312. A portion of the polysilicon outside of the trenches 358 is then removed, via step 314. Preferably, the polysilicon layer provided in step 312 is polished in step 314 to remove the excess polysilicon. The remaining portion of the polysilicon in the trenches forms the word lines.

A method and system has been disclosed for a flash memory device which can have a higher density of lines. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing lines and spaces in a semiconductor device on a semiconductor substrate, the semiconductor device including an insulating layer over the substrate, the method comprising the steps of:

(a) providing a reverse mask on the insulating layer, the reverse mask including a plurality of apertures therein, each of the plurality of apertures having a first width;

(b) trimming the reverse mask to increase a size of each of the plurality of apertures;

(c) removing a portion of the insulating layer exposed by the plurality of apertures to provide a plurality of trenches, the reverse mask being used as a mask during removal of the portion of the insulating layer; and (d) providing a plurality of lines in the plurality of trenches, the plurality of lines being conductive lines;

wherein the insulating layer is above a plurality of floating gates.

2. The method of claim 1 wherein the plurality of apertures have a symmetric pitch such that each of the plurality of apertures is separated by a distance that is the same as the first width prior to trimming the reverse mask.

3. The method of claim 1 wherein the plurality of apertures have an asymmetric pitch such that each of the plurality of apertures is separated by a distance that is different from the first width prior to trimming the reverse mask.

4. The method of claim 1 wherein the plurality of lines providing step (d) further includes the steps of:

(d1) providing a conductive layer on the insulating layer;

(d2) removing a portion of the conductive layer outside of the plurality of trenches to provide the plurality of lines separated by a plurality of spaces, the plurality of lines having an asymmetric pitch such that each of the plurality of spaces is narrower than each of the plurality of lines.

5. The method of claim 4 wherein the conductive layer is a polysilicon layer.

6. The method of claim 1 further comprising the step of:

(e) removing the reverse mask prior to providing the plurality of lines in the plurality of trenches.

7. The method of claim 1 wherein the reverse mask providing step (a) further includes the step of:

(a1) providing the reverse mask such that the first width of each of the plurality of apertures is at a minimum feature size.

8. The method of claim 7 wherein the first width is 0.15 microns.

9. The method of claim 1 wherein the plurality of lines further includes a plurality of word lines.

10. A method for providing lines and spaces in a semiconductor device on a semiconductor substrate, the semiconductor device including an insulating layer over the substrate, the method comprising the steps of:

(a) providing a reverse mask on the insulating layer, the reverse mask including a plurality of apertures therein, each of the plurality of apertures having a first width, wherein the plurality of apertures have a symmetric pitch such that each of the plurality of apertures is separated by a distance that is the same as the first width;

(b) removing a first portion of the insulating layer exposed by the plurality of apertures to provide a plurality of trenches, each of the plurality of trenches having a width;

(c) trimming a second portion of the insulating layer to increase the width of each of the plurality of trenches; and (d) providing a plurality of lines in the plurality of trenches.

11. A method for providing lines and spaces in a semiconductor device on a semiconductor substrate, the semiconductor device including an insulating layer over the substrate, the method comprising the steps of:

(a) providing a reverse mask on the insulating layer, the reverse mask including a plurality of apertures therein, each of the plurality of apertures having a first width, wherein the plurality of apertures have an asymmetric pitch such that each of the plurality of apertures is separated by a distance that is different from the first width;

(b) removing a first portion of the insulating layer exposed by the plurality of apertures to provide a plurality of trenches, each of the plurality of trenches having a width;

(c) trimming a second portion of the insulating layer to increase the width of each of the plurality of trenches; and (d) providing a plurality of lines in the plurality of trenches.

* * * * *

UNITED STATES PATENT AND TRADEMARK OFFICE
CERTIFICATE OF CORRECTION

PATENT NO.    : 6,727,195 B2
DATED         : April 27, 2004
INVENTOR(S)   : Michael K. Templeton and Mark S. Chang It is certified that error appears in the above-identified patent and that said Letters Patent is hereby corrected as shown below:

Column 1,
Line 31, please replace "memos" with -- memory --.

Signed and Sealed this

Sixth Day of July, 2004

JON W. DUDAS
*Acting Director of the United States Patent and Trademark Office*